United States Patent [19]

Iwaki et al.

[11] 4,442,196

[45] Apr. 10, 1984

[54] PHOTOSENSITIVE COMPOSITION

[75] Inventors: Akio Iwaki, Hachioji; Noriyasu Kita, Musashimurayama; Tatsuya Sasazawa; Hiroyoshi Yamaguchi, both of Hachioji, all of Japan

[73] Assignee: Konishiroku Photo Industry Co., Ltd., Tokyo, Japan

[21] Appl. No.: 207,087

[22] Filed: Nov. 14, 1980

Related U.S. Application Data

[63] Continuation of Ser. No. 29,350, Apr. 11, 1979, abandoned.

[30] Foreign Application Priority Data

Apr. 12, 1978 [JP] Japan .................................. 53-42940

[51] Int. Cl.$^3$ ................................................. G03C 1/52
[52] U.S. Cl. .................................... 430/195; 430/197; 430/270; 430/287; 204/159.11; 204/159.14; 204/159.22; 260/349
[58] Field of Search .......................... 96/91 N, 115 R; 260/349, 348.15; 430/195, 197, 287, 270; 204/159.11, 159.14, 159.22

[56] References Cited

U.S. PATENT DOCUMENTS

| | | | |
|---|---|---|---|
| 3,257,664 | 6/1966 | Leubner | 430/285 |
| 3,395,120 | 7/1968 | Bremmer et al. | 260/348.15 |
| 3,804,862 | 4/1974 | Fetscher et al. | 260/348.15 |
| 3,843,603 | 10/1974 | Gates | 430/195 |
| 3,933,885 | 1/1976 | Satomura | 430/195 |
| 4,229,514 | 10/1980 | Kurita | 430/195 |

OTHER PUBLICATIONS

Journal of Polymer Science, Part B, vol. 9, pp. 81–83 (1971).
Journal of Polymer Science, Part A, vol. 10, pp. 2379–2387 (1972).

*Primary Examiner*—Won H. Louie, Jr.
*Attorney, Agent, or Firm*—Jordan B. Bierman; Linda Bierman

[57] ABSTRACT

The main photosensitive ingredient of the photosensitive composition is prepared by subjecting a polymer, which is obtained by homopolymerizing, or copolymerizing with another copolymerizable monomer, a monomer of the general formula

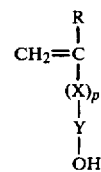

in which R represents a hydrogen atom, a halogen atom, or an alkyl group, Y represents a substituted or unsubstituted phenylene group or a substituted or unsubstituted naphthylene group, p is 0 or 1, and when p=1, X represents a divalent organic group, to reaction with p-azidocinnamylidene-α-cyanoacetic chloride in the presence of an organic or inorganic base.

5 Claims, No Drawings

PHOTOSENSITIVE COMPOSITION

This is a continuation of application Ser. No. 29,350, filed Apr. 11, 1979, now abandoned.

This invention relates to a photosensitive composition which is reduced in solubility or is turned insoluble by the action of light. More particularly, it relates to a photosensitive composition which comprises a photosensitive polymer compound having a residue of azidocinnamylidene-α-cyanoacetic acid as the photosensitive group.

Azido compounds photolytically release nitrogen gas to produce free radicals of nitrene. As is well known, the nitrene takes part in hydrogen-withdrawing reactions, addition reactions to double bond or a coupling reaction of itself, so that if, for example, a photosensitive polymer having introduced therein a great number of azido groups is exposed to actinic light, an area where exposed is photolytically crosslinked and thus rendered insoluble in solvent. It is also known that since α,β-unsaturated ketone groups are dimerized by actinic light to form a four-membered ring, a polymer containing α,β-unsaturated ketone groups can be insolubilized against solvent by the photolytic crosslinking reaction.

By utilizing the nature of these compounds, there can be obtained a negative relief with regard to an original image to be used on imagewise exposure as follows: A photosensitive composition containing as the photosensitive component the azido compound or α,β-unsaturated ketone compound is applied onto a suitable support to give a photosensitive material; and the material thus obtained is subjected to imagewise exposure and then to a development treatment with a solvent to dissolve the areas where not exposed.

Heretofore, there are known a variety of polymeric compounds having as photosensitive group azido groups or α,β-unsaturated ketone groups, including, for example, polyvinylazidobenzoic acid esters and polyvinylcinnamic acid esters. However, these esters are low in sensitivity when used singly, and sensitizers are necessary for practical applications. As photosensitive compounds or compositions having increased photosensitivity, there are known photosensitive polymeric compounds having azidocinnamic acid groups such as described, for example, in Journal of Polymer Science, Part B, Vol. 9, pages 81–83 (1971) or Part A-1, Vol. 10, pages 2379–2387 (1972), or photosensitive polymeric compounds having cinnamylideneacetic acid groups and compositions using such compounds such as disclosed, for example, in U.S. Pat. No. 3,257,664. However, these are all poor in storage stability.

An object of the present invention is to provide a photosensitive polymeric compound which is free of the disadvantages of the known photosensitive compositions.

Another object of the present invention is to provide a photosensitive composition which uses the above photosensitive polymeric compound as a photosensitive component and which is excellent in physical, chemical and image characteristics.

Further and other objects of the invention will become apparent from the following description.

We have found that the above objects can be achieved by photosensitive polymeric compounds having in the polymeric structure thereof a structural unit expressed by the following general formula (I) (which will be hereinafter referred to merely as photosensitive polymeric compound(s) of the invention)

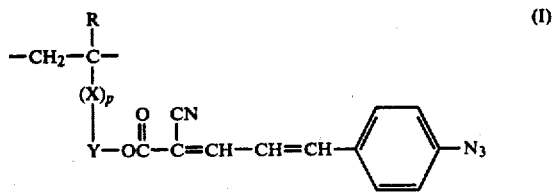

(in which R represents a hydrogen atom, a halogen atom or an alkyl group, Y represents a substituted or unsubstituted phenylene group or a substituted or unsubstituted naphthylene group, p is 0 or 1, and when p=1, X represents a divalent organic group serving to join therethrough the carbon atom of the main chain of the polymer and the carbon atom of the aromatic ring expressed by Y) and photosensitive compositions comprising at least one photosensitive polymeric compound defined above.

The photosensitive polymeric compound of the invention is particularly suitable for producing images, relief images or printing plates by applying it onto suitable support. For instance, the photosensitive polymeric compounds are coated onto metal plates for use as a photosensitive layer for relief and lithographic printing plates, substrates for printed circuit, name plates and the like. Aside from the above, they may be used to make negative originals for plate making, slides, originals for duplication and the like articles by application to transparent films such as of polyester.

The photosensitive polymeric compound of the invention is characterized by having in the molecule thereof a structure expressed by the afore-indicated general formula (I) and may further comprise one or more other structure units (monomers).

The monomers to be used as the other structural units include, for example, o-, m- or p-hydroxystyrene, o-, m- or p-hydroxyacrylanilide, o-, m- or p-hydroxymethacrylanilide, 5-hydroxy-ethylene, propylene, butadiene, styrene, α-methylstyrene, acrylic acid, methacrylic acid, maleic anhydride, methyl acrylate, ethyl acrylate, methyl α-chloroacrylate, methyl methacrylate, acrylonitrile, acrylamide, methacrylamide, vinyl acetate, vinyl chloride, vinylidene chloride, vinylidene cyanide, vinyl methyl ketone, vinyl ethyl ether, N-vinylpyrrolidone, N-vinylpyridine, N-vinylcarbazole and the like. By the introduction of the above-exemplified monomers in suitable combination into the structural formula of the photosensitive polymeric compound according to the invention, the photosensitive duplicating layer obtained by coating a support with a thin layer coating can be improved remarkably in various characteristic properties such as mechanical strength, flexibility, filmforming ability, resistance to chemicals, etc. Especially when monomers having a phenolic hydroxyl group or a carbonyl group are introduced in suitable combination, it becomes possible to treat the layer with an aqueous alkaline solution, thereby making it possible to prevent any environmental problem or public nuisance.

The photosensitive polymeric compounds according to the invention will be particularly mentioned hereinbelow, in which Mn means an average molecular weight, and p:q:r:s means molar ratios of the individual structural units.

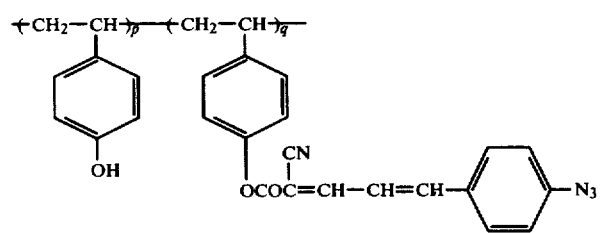
(1)
$\overline{M}n = 10000$
p:q = 75:25
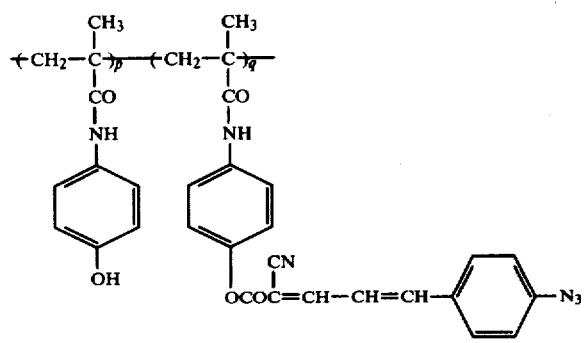
(2)
$\overline{M}n = 30000$
p:q = 75:25
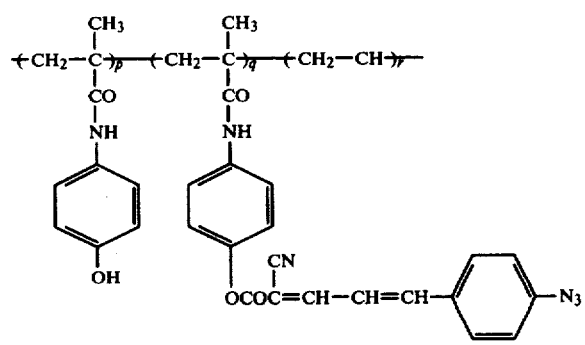
(3)
$\overline{M}n = 20000$
p:q:r = 50:25:25
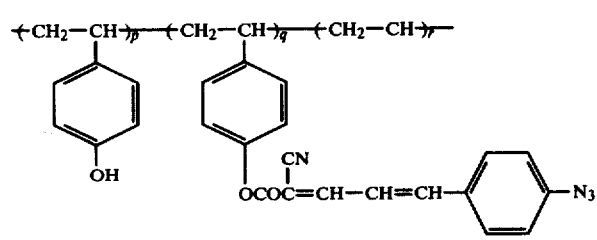
(4)
$\overline{M}n = 40000$
p:q:r = 25:25:50

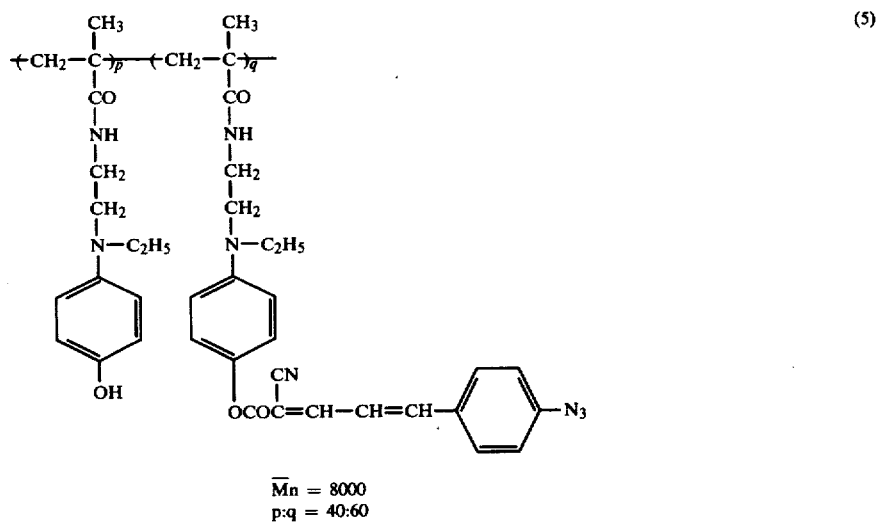
(5)
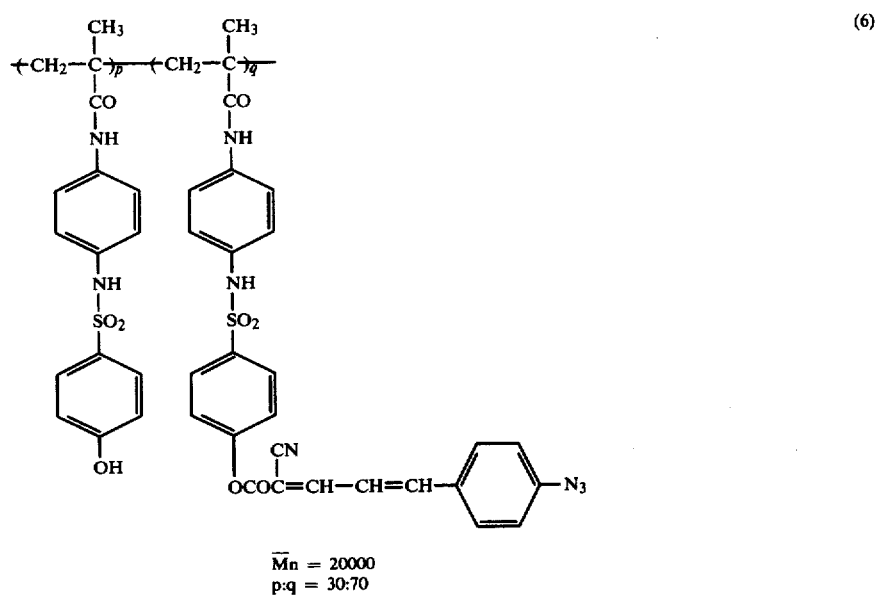
(6)
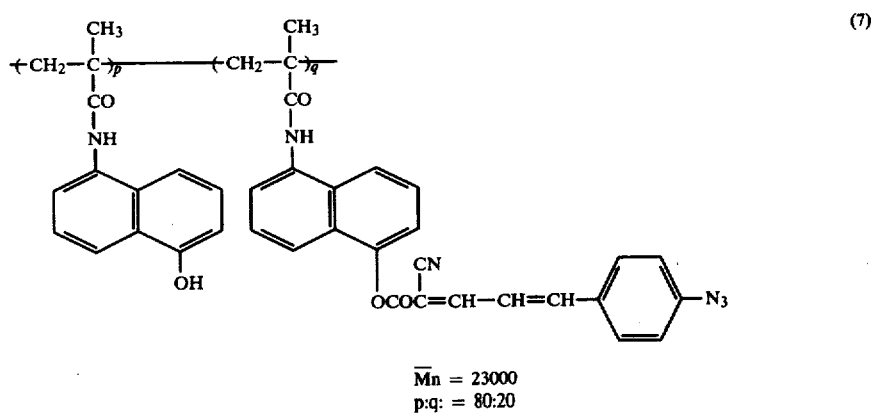
(7)

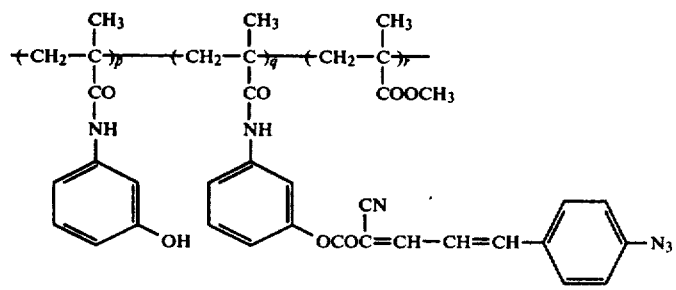
(8)
$\overline{M}n = 70000$
p:q:r = 20:30:50
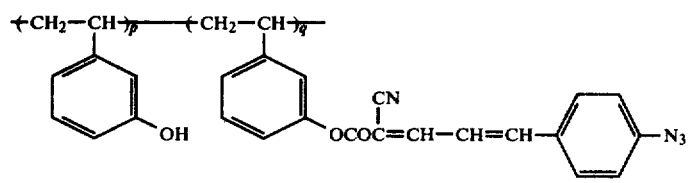
(9)
$\overline{M}n = 10000$
p:q = 50:50
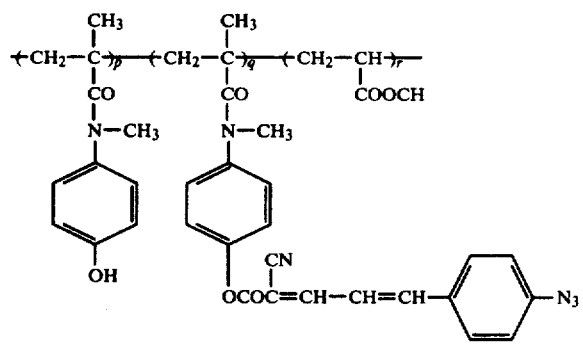
(10)
$\overline{M}n = 100000$
p:q:r = 40:10:50
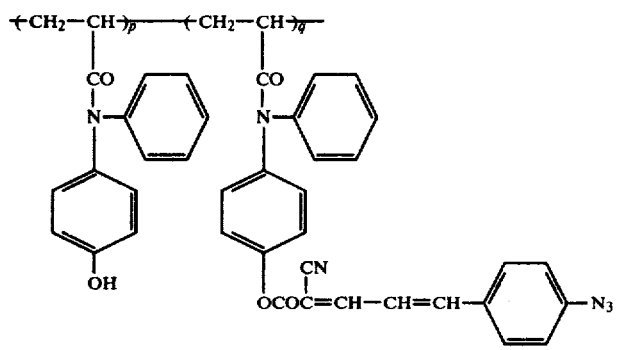
(11)
$\overline{M}n = 10000$
p:q = 70:30

-continued
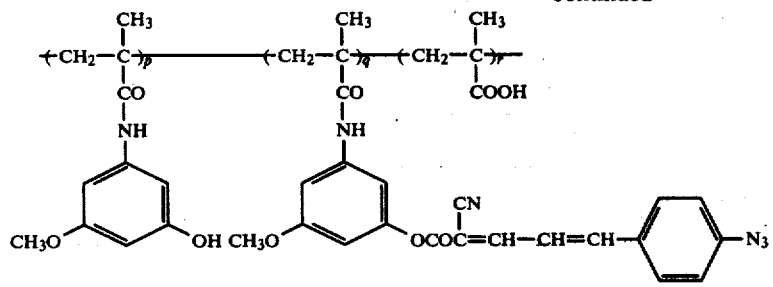
(12)
$\overline{Mn} = 200000$
p:q:r = 50:40:10
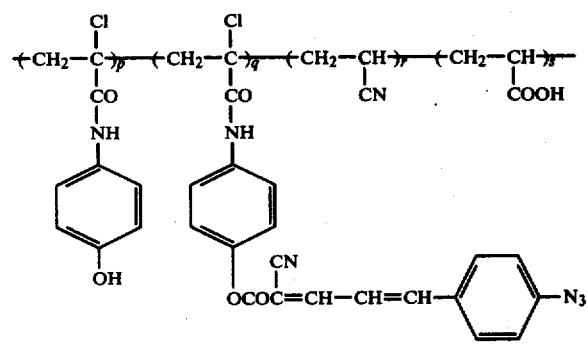
(13)
$\overline{Mn} = 300000$
p:q:r:s = 40:10:40:10
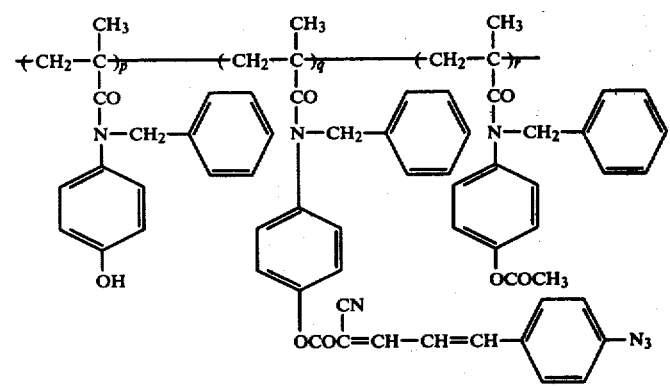
(14)
$\overline{Mn} = 600000$
p:q:r = 40:30:30
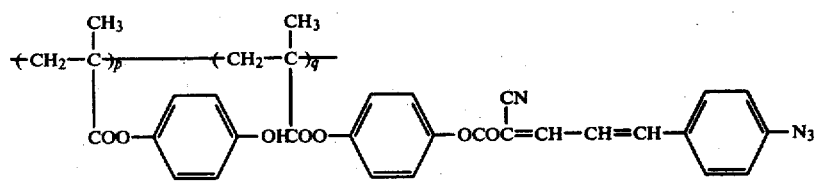
(15)
$\overline{Mn} = 3000$
p:q = 50:50
The photosensitive polymers of the present invention can be readily synthesized by subjecting a polymer, which is obtained by homopolymerizing, or copolymerizing with another copolymerizable monomer, a monomer of the general formula (II)

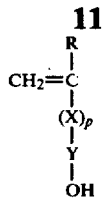

(in which R represents a hydrogen atom, a halogen atom, or an alkyl group, Y represents a substituted or unsubstituted phenylene group or a substituted or unsubstituted naphthylene group, p is 0 or 1, and when p=1, X represents a divalent organic group), to reaction with p-azidocinnamylidene-α-cyanoacetic chloride in the presence of an organic or inorganic base.

The polymeric compound of the invention should have in the molecule thereof the structural unit of the above general formula in an amount of at least 5 mole%, preferably 10–60 mole% and its molecular weight is generally in the range of 1000 to 1,000,000, and preferably 2000 to 100,000.

The synthesis of typical photosensitive polymeric compounds of the invention will be illustrated by way of the following synthetic examples. Synthetic Example 1 (Synthesis of Exemplified Compound (1))

60.0 g of p-hydroxystyrene and 0.6 g of α,α'-azobisisobutyronitrile were dissolved in 120 ml of tetrahydrofuran and heated at 65° C. for 30 hours in a nitrogen gas-substituted, sealed tube. The resulting polymer solution was poured into water, followed by collecting the resultant yellow precipitate by filtration and drying to obtain 42 g of polymer (A). The polymer (A) was found to have a molecular weight of about 7000 when measured by a vapor pressure method. 20.4 g of the polymer (A) was dissolved in 140 ml of acetone and 200 ml of dry pyridine and maintained at 50° C., to which was then added portionwise 9.7 g of azidocinnamylidene-α-cyanoacetic acid chloride with agitation of the reaction solution. After completion of the addition, the reaction was carried out at 50° C. for 5 hours and, as a result, the reaction solution was turned brown in color. The solution was poured, with agitation, into a mixed solution of 2 l. of ice water and 60 ml of concentrated hydrochloric acid to produce a precipitate, followed by filtering by suction, washing with water and drying to obtain 27.4 g of the exemplified compound (1). Synthetic Example 2 (Synthesis of Exemplified Compound (2))

124 g of p-hydroxymethacrylanilide, 1,149 g of α,α'-azobisisobutyronitrile and 1,416 g of n-dodecylmercaptan were dissolved in a mixed solvent of acetone and methanol (1:1), followed by heating in a nitrogen gas-substituted, sealed tube at 65° C. for 30 hours to obtain a polymer solution.

The thus obtained polymer solution was charged into water and the resulting white precipitate was collected by filtration and dried to obtain 101 g of white polymer (B).

The polymer (B) was found to have a molecular weight of about 23,000 when measured by an osmotic pressure method.

30 g of this white polymer (B) was completely dissolved in a mixed solvent of 400 ml of dry pyridine and 60 ml of γ-butyrolactam and maintained at 50° C., to which was added 10.9 g of p-azidocinnamylidene-α-cyanoacetic acid chloride portionwise with agitation of the reaction solution. After completion of the addition, the reaction was carried out at 50° C. for 5 hours and, as a result, the reaction solution was turned into a brown transparent solution. The solution was allowed to stand at room temperature overnight and then charged, with agitation, into a mixed solution of 3 l. of ice water and 80 ml of concentrated hydrochloric acid to give a precipitate, followed by filtering by suction, washing with water and drying to obtain 38.5 g of the exemplified compound (2). Synthetic Example 3 (Synthesis of Exemplified Compound (3))

66.5 g of p-hydroxymethacrylanilide, 13 g of styrene, 0.82 g of α,α'-azobisisobutyronitrile and 10 g of n-dodecylmercaptan were dissolved in 250 ml of a mixed solvent of acetone and methanol (1:1) and interacted in a nitrogen gas-substituted, sealed tube at 65° C. for 30 hours to give a polymer solution. The polymer solution was charged into water and the resulting white precipitate was filtered and dried to obtain 79.0 g of white polymer (C). The polymer (C) was found to have a molecular weight of about 13000 when measured by the vapor pressure method.

40.0 g of the white polymer (C) was completely dissolved in 200 ml of pyridine and 60 ml of γ-butyrolactone and maintained at 50° C., to which was added 16.2 g of p-azidocinnamylidene-α-cyanoacetic acid chloride portionwise with agitation of the reaction solution, followed by treating in the same manner as in Synthetic Example 1 to obtain 53.0 g of the exemplified compound (3) of light yellow color. Synthetic Example 4 (Synthesis of Exemplified Compound (4))

30 g of p-hydroxystyrene, 26 g of styrene and 0.6 g of α,α'-azobisisobutyronitrile were dissolved in 120 ml of tetrahydrofuran and then heated in a nitrogen gas-substituted, sealed tube at 65° C. for 30 hours. Then, the procedures of Synthetic Example 1 were repeated to obtain 54 g of light brown polymer (D). The thus obtained (D) was found to have a molecular weight of about 34000 when measured by an osmotic pressure method.

28 g of the polymer (D) was dissolved in 140 ml of acetone and 200 ml of dry pyridine and maintained at 50° C., to which was added 16.2 g of p-azidocinnamylidene-α-cyanoacetic acid chloride portionwise with agitation of the reaction solution. After completion of the addition, the reaction was carried out at 50° C. for 5 hours, followed by treating in the same manner as in Synthetic Example 1 to obtain 41 g of the light yellow, exemplified compound (4). Synthetic Example 5 (Synthesis of Exemplified Compound (7))

227 g of 5-amino-α-naphthol, 1 g of hydroquinone methyl ether and 2 l. of pyridine were mixed and cooled to −10° C. by the use of a cryogen, into which was dropped 110 g of methacrylic acid chloride with agitation. After completion of the dropwise addition, the reaction system was agitated at 0°–3° C. for 2 hours and then at 25° C. for an additional 2 hours, followed by charging it into 20 l. of ice water to produce a precipitate, filtering, washing with water and drying. The resulting solids were added to 2 l. of a mixed solution of methanol and 5% sodium carbonate solution (1:1) and agitated at 40° C., which was then charged into 4 l. of 5% hydrochloric acid to obtain a precipitate in large amount. The precipitate was filtered by suction and recrystallized from ethanol to obtain 210 g of N-(5-hydroxy-α-naphthyl)methacrylamide having a melting point of 223°–224° C.

182 g of the thus obtained N-(5-hydroxy-α-naphthyl)methacrylamide, 1.31 g of α,α'-azobisisobutyronitrile and 1.62 g of dodecylmercaptan were mixed and then dissolved in 600 ml of a mixed solvent of acetone and methanol (1:1) and heated in a nitrogen gas-substituted, sealed tube at 65° C. for 40 hours to obtain a polymer solution.

This polymer solution was diluted with 200 ml of methanol, and then charged into water. The resulting precipitate was filtered and dried to obtain 180 g of polymer (E). The polymer (E) was found to have a molecular weight of 19000 as measured by an osmotic pressure method.

30 g of the polymer (E) was dissolved in a mixed solvent of 400 ml of dried pyridine and 100 ml of γ-butyrolactone, into which was added dropwise 6.8 g of p-azidocinnamylidene-α-cyanoacetic acid chloride while maintaining the total solution at 50° C. under agitation.

After completion of the addition, the reaction system was subjected to reaction at 50° C. for 5 hours and then the reaction mixture was charged into a mixed solution of 4 l. of ice water and 80 ml of concentrated hydrochloric acid to produce a precipitate, followed by filtering by suction, washing with water and then drying to obtain 35.5 g of the exemplified compound (7). Synthetic Example 6 (Synthesis of Exemplified Compound (8))

104 g of m-hydroxyaniline, 0.5 g of hydroquinone monomethyl ether, 170 g of methacrylic anhydride and 200 ml of water were mixed and reacted at 70° C. for 2 hours, and cooled, to which was added 500 ml of 5% hydrochloric acid to produce a precipitate, followed by filtering by suction to obtain a white solid. This white solid was dissolved in 500 ml of methanol with heating conditions, to which was further added 500 ml of 5% sodium carbonate solution. After agitating at 40° C. for 30 minutes, the solution was charged into 2 l. of 5% hydrochloric acid to give a precipitate in large amount, followed by filtering by suction and recrystallizing from ethanol to obtain 130 g of white crystals of m-hydroxymethacrylanilide having a melting point of 171°–173° C.

44.3 g of the thus obtained m-hydroxymethacrylanilide, 25 g of methyl methacrylate and 0.82 g of α,α'-azobisisobutyronitrile were dissolved in 200 ml of a mixed solvent of acetone and methanol (1:1) and heated for reaction in a nitrogen gas-substituted sealed tube at 65° C. for 30 hours. The reaction solution was diluted with 200 ml of a mixed solvent of methanol and acetone (1:1) and then charged into water to produce a white precipitate, followed by filtering and drying to obtain 58 g of white polymer (F). This polymer (F) was found to have a molecular weight of 45000 as measured by an osmotic pressure method.

30 g of the white polymer and 19.4 g of p-azidocinnamylidene-α-cyanoacetic acid chloride were dissolved in a mixed solvent of 600 ml of tetrahydrofuran and 20 ml of water, into which was dropped 200 ml of 1 N sodium carbonate while agitating at 40° C. The agitation was continued for an additional 30 minutes and the reaction solution was charged into 3 l. of diluted hydrochloric acid to produce a precipitate. The precipitate was filtered by suction, washed with water and dried to obtain 45.8 g of the exemplified compound (8).

The photosensitive polymeric compounds of the invention synthesized as described hereinabove must be stored in the dark because of their photosensitivity. In the dark, they do not decompose and are stable over a long time of storage and show only small hygroscopicity, without involving any significant loss of various characteristics necessary as a photosensitive material.

The present invention also relates to a photosensitive composition which comprises at least one photosensitive polymeric compound described above as a photosensitive component. The photosensitive polymeric compound of the invention which is a resin having a high molecular weight shows excellent film-forming ability and excellent storage stability and adhesiveness without suffering from any trouble of crystallization. Accordingly, the compound may be singly dissolved in organic solvent to obtain a good photosensitive composition. In this connection, however, in order to further improve the coating or developing performance of the photosensitive composition, other resins may be mixed with the polymeric compound according to the invention.

Examples of such other resins include synthetic polymers such as polyamides, polyesters, polyvinyls, polyurethanes and the like, natural resins such as shellacs, rosins and the like, phenol-formalin-novolac resins, m-cresol-formalin-novolac resins, cellulose alkyl ethers such as cellulose methyl ether, cellulose ethyl ether and the like. The polymeric compounds of the invention show good compatibility with the above-mentioned resins and are effectively usable in various combinations with such resins. Use of the cellulose alkyl ethers is particularly effective in improving coating characteristics.

The photosensitive composition according to the invention may be incorporated with other photosensitive ingredients such as known low molecular weight azido compounds, particularly low molecular weight bisazido compounds, and also with various additives. For instance, there may be used dyes or pigments such as acridine dyes, cyanine dyes, merocyanine dyes, styryl dyes, triphenylmethane dyes and the like as a colorant for visualizing images.

The known polymer compounds or resins or other low molecular weight azido compounds may be added in an amount of about 0.1 to 10 times, by weight, that of the photosensitive polymeric compound of the invention.

The photosensitive composition according to the invention may further comprise plasticizers showing good compatibility with the polymeric compound of the invention. In this sense, very useful plasticizers are, for example, phthalate esters, phosphate esters, aliphatic carboxylic acid esters, glycol derivatives and sulfonamides. These plasticizers contribute to impart flexibility to the photosensitive film obtained from the photosensitive composition, increase spreadability, and improve the coating characteristics on application of the photosensitive composition and also the film-forming ability to a considerable extent. The plasticizer is generally added in an amount of 0.05 to 0.5 times, preferably 0.15 to 0.25 times, that of the photosensitive polymeric compound of the invention on the weight basis.

In order to improve the sensitivity to a range of photosensitive wavelengths of the photosensitive composition according to the invention, sensitizers may be added to the composition. Suitable examples of the sensitizer include Michler's ketone, 9-fluorenone, 1-nitropyrene, 5-nitroacenaphthene, 1,8-dinitropyrene, 2-chloro-1,2-benzanthraquinone, 2-bromo-1,2-benzanthraquinone, pyrene-1,6-quinone, anthanthrone, 2-chloro-1,8-phthaloylnaphthalene, cyanoacridine and the like. The amount of the sensitizer in the photosensitive composition is preferred to be in the range of 0.1-20 parts by weight per 100 weight per 100 parts by weight of the photosensitive polymeric compound according to the invention.

The photosensitive composition of the invention is coated onto a suitable support such as an aluminum plate, zinc plate, copper plate, plastic film, paper or a laminate such as a bimetal or trimetal and dried. The dried plate or sheet is ready for use in various fields. In application, the coating composition is desired to have a total solid content of the photosensitive composition in a range of 0.1 to 50 wt% of an organic solvent used. Useful organic solvents are, for example, methyl cellosolve, ethyl cellosolve, ethyl cellosolve acetate, dioxane, acetone, cyclohexane, γ-butyrolactone, tetrahydrofuran, dimethylsulfoxide, dimethylformamide, methyl cellosolve acetate and the like. The photosensitive composition of the invention is very stable and, if stored in the dark, stands storage over a long time. The photosensitive duplicating layer formed on the support by the use of the photosensitive composition may also be kept unchanged over a year or more on storage in the dark.

The photosensitive duplicating layer is applicable by any of usual methods. For instance, an original having a line image or half-tone image is brought into intimate contact with the photosensitive surface and exposed to light, followed by developing with a suitable solvent to obtain a relief image of the negative type with regard to the original. Suitable light sources for the exposure are a carbon arc lamp, mercury lamp, Xenon lamp, chemical lamp, photographic flash lamp and the like. The organic solvents useful for development are, for example, acetone, methyl ethyl ketone, cyclohexanone, methyl cellosolve, ethyl cellosolve, ethyl cellosolve acetate, phenyl cellosolve, dioxane, tetrahydrofuran, methyl carbitol, methyl carbitol acetate, ethyl carbitol acetate, γ-butyrolactone, dimethylformamide, N-methylpyrrolidone, benzyl alcohol, phenethyl alcohol and mixtures thereof. Aqueous solvents may also be used including aqueous alkaline solutions such as of sodium hydroxide, sodium carbonate, sodium metasilicate, sodium phosphate, potassium carbonate and the like. The aqueous alkaline solution may be incorporated with a development accelerator, an organic solvent serving as an anti-swelling agent, and a surface active agent.

The relief image thus obtained shows a great resistance to chemicals and is thus substantially stable against an etching liquid such as nitric acid or ferric chloride solution, so that it is effectively usable as relief and intaglio printing plates, name plate, or substrate for printed circuit. Further, the relief image is hydrophobic and shows an excellent mechanical strength, and is thus useful as a lithograph such as a pre-sensitized plate. In addition, the relief image exhibits great durability to printing, permitting reproduction of a great number of prints.

The photosensitive film which is obtained by applying the photosensitive composition of the invention onto a transparent film such as a polyester film is high in photographic density against light in the wavelength range of about 340 nm-440 nm and shows a maximum absorption peak at 400 nm. Accordingly, this photosensitive film is especially useful as a photosensitive medium for a transparent original to make a printing plate which is used to expose, for example, a presensitized plate to light in an imagewise manner by a ultraviolet ray-rich light source such as a chemical lamp, mercury lamp or metal halide lamp.

The photosensitive composition and the photosensitive duplicating layer obtained from the composition are considered to be very useful.

The present invention will be particularly illustrated by way of the following examples, which should not be construed as limiting thereto the present invention.

EXAMPLE 1

10 g of each of the exemplified compound Nos. (1), (2), (3), (4), (7) and (8) obtained in Synthetic Examples 1, 2, 3, 4, 5 and 6, respectively, was dissolved in 200 ml of a solvent, which was then applied onto a sand-blasted aluminum plate by means of a rotary applicator and dried.

For comparison, the above process was repeated using (A) polyvinyl cinnamate, (B) polyvinyl cinnamylideneacetate (C) polyvinyl-α-cyanocinnamate, (D) polyvinyl-p-azidocinnamate and (E) polyvinyl-p-azidobenzoate.

The thus obtained specimens were each brought into an intimate contact on its photosensitive surface with the stepwedge, Kodak Autographic Step Tablet No. 2, exposed for 3 minutes by the use of a 3 KW mercury lamp at a distance of 1 m from the surface, and developed. The sensitivity of each specimen was evaluated by the remaining number of steps. The storage stability was also determined by keeping each specimen at 50° C. for 10 days and then subjecting it to the same procedures as described above to check a variation of the photosensitive characteristics. The photosensitive plates using the compound Nos. (1), (2), (3), (4), (7) and (8) were found to give clear colored images after the exposure, with improved processability.

TABLE 1

| Photosensitive Material | Solvent used for Composition | Developer | Photosensitivity | Storage Stability |
|---|---|---|---|---|
| A | Methyl ethyl ketone | Methyl ethyl ketone | x | o |
| B | Methyl ethyl ketone | Methyl ethyl ketone | o | x |
| C | Methyl ethyl ketone | Methyl ethyl ketone | Δ | o |
| D | Cyclohexanone | Cyclohexanone | o | x |
| E | Cyclohexanone | Cyclohexanone | Δ | o |
| Exemplified Compound (1) | Ethyl cellosolve | 3% Sodium silicate | o | o |
| (2) | Ethyl cellosolve | 3% Sodium silicate | o | o |
| (3) | Ethyl cellosolve | Ethyl cellosolve | o | o |
| (4) | Ethyl cellosolve | Ethyl cellosolve | o | o |
| (7) | Ethyl cellosolve | Ethyl cellosolve | o | o |
| (8) | Ethyl cellosolve | Ethyl cellosolve | o | o |

Note:
Sensitivity:
o: Above 9 steps
Δ: 8-4 steps
x: Below 4 steps
Storage Stability:
o: Not fogged
x: Fogged

EXAMPLE 2

Photosensitive film specimens were made in the same manner as in Example 1 except that a 100μ thick polyester base was used as a support and a dip coating system was used as the applicator.

The photosensitive layer was controlled to have a thickness of 2.5μ in each case. Each of the photosensitive films was tested by intimately contacting a negative original bearing line and a half-tone images with its photosensitive surface and exposed for 20 seconds by means of a 3 KW mercury lamp at a distance of 50 cm from the surface, followed by developing with developing solutions indicated in Table 2, respectively, and washing with water to eliminate non-exposed portions from the surfaces thereby obtaining positive images.

The thus obtained transparent positive images were measured to determine their absorbance at 400 nm, with the results shown in Table 2. When the positive images for the exemplified compound Nos. (1), (2), (3), (4), (7) and (8) were each used to make a printing plate by bringing a commercially available positive PS plate into intimate contact with and then exposure to the positive image by means of a mercury lamp, printing plates were obtained similarly to the case using a transparent positive picture from a silver salt.

TABLE 2

| Photosensitive Material | Solvent used for Composition | Developer | Absorbance of 400 nm | Storage Stability |
|---|---|---|---|---|
| A | Methyl ethyl ketone | Methyl ethyl ketone | 0.4 | o |
| B | Methyl ethyl ketone | Methyl ethyl ketone | 1.0 | x |
| C | Methyl ethyl ketone | Methyl ethyl ketone | 0.4 | o |
| D | Cyclohexanone | Cyclohexanone | 1.0 | x |
| E | Cyclohexanone | Cyclohexanone | 0.4 | o |
| Exemplified Compound (1) | Ethyl cellosolve | 1% Phenyl cellosolve and 1% metasilicate-containing aqueous solution | 3.5 | o |
| (2) | Ethyl cellosolve | 1% Phenyl cellosolve and 1% metasilicate-containing aqueous solution | 3.5 | o |
| (3) | Ethyl cellosolve | Ethyl cellosolve | 3.5 | o |
| (4) | Ethyl cellosolve | Ethyl cellosolve | 3.5 | o |
| (7) | Ethyl cellosolve | Ethyl cellosolve | 3.0 | o |
| (8) | Ethyl cellosolve | Ethyl cellosolve | 3.5 | o |

Note:
The storage stability was evaluated in the same manner as in Example 1.
o: Not fogged
x: Fogged

EXAMPLE 3

40 g of the compound (2) obtained in Synthetic Example 2 was dissolved in 800 ml of methyl cellosolve, applied onto a sand-blasted aluminum plate by means of a rotary applicator, and dried. A negative original with a line image and a half-tone picture was brought into intimate contact with the photosensitive surface of the photosensitive plate, followed by exposing to light for 1 minute by means of a 3 KW mercury lamp at a distance of 1 m from the photosensitive surface. The exposed plate was immersed in an aqueous 2% sodium metasilicate solution for 1 minute and was softly rubbed with absorbent cotton for eliminating non-exposed portions to obtain a positive relief image with excellent hydrophobic property. This relief image was treated with water to impart water retention thereto and then mounted on an off-set printing machine to give a number of prints with good image.

EXAMPLE 4

10 g of the compound (3) obtained in Synthetic Example 3, 0.6 g of nitroacenaphthene and 70 mg of Victoria Blue Base F4R (available from BASF) were dissolved in 200 ml of ethyl cellosolve, which was then applied onto a sand-blasted aluminum plate by the use of a rotary applicator and dried. The resulting photosensitive plate was subjected to imagewise exposure similarly to the case of Example 3. Then, a mixed solvent of γ-butyrolactone, glycerine, water and 75% phosphoric acid (70:23:5:2) was dropwise applied over the entire surface of the photosensitive plate, followed by allowing to stand for 1 minute. Thereafter, when the solvent was removed by rubbing the plate surface with absorbent cotton, non-exposed portions were also removed to obtain a positive relief image with excellent hydrophobic property. This plate was treated with water to impart water retention thereto and mounted on an off-set printing machine to make a number of prints with good image.

EXAMPLE 5

10 g of the compound (4) obtained in Synthetic Example 4, 400 g of cellulose ethyl ether and 100 g of a triphenylmethane dye (Victria Pure Blue BOH, product of Hodogaya Chem. Co., Ltd.) were dissolved in 100 ml of a mixed solvent of dimethylformamide and methyl cellosolve (2:8). The solution was applied onto a surface-abraded zinc plate for printing by the use of a rotary applicator and dried. The resulting photosensitive plate was superposed on its photosensitive surface with a transparent film original, which was set in a vacuum printer and exposed to light from a carbon arc lamp at a distance of about 40 cm for about 1 minute, followed by developing with ethyl cellosolve for eliminating non-exposed portions to obtain a negative relief image with regard to the strongly acid-resistant blue original. The negative relief image-bearing plate was etched with the Dow etching solution, washed with water, and mounted on a relief printing machine. As a result, a great number of prints were obtained with a clear printed image.

EXAMPLE 6

5 g of the compound (7) obtained in the Synthetic Example 5, 0.3 g of Michler's ketone, 150 mg of cellulose ethyl ether and 1 g of N-butylpyrrolidone were dissolved in 100 ml of methyl cellosolve, which was applied onto a sand-blasted aluminum plate by means of a rotary applicator and dried. A negative original with a line image and a half-tone picture was brought into intimate contact with the photosensitive surface of the resulting photosensitive plate, which was exposed for 5 minutes by means of a chemical lamp. After the exposure, the photosensitive surface was subjected to development with ethyl cellosolve for removing non-exposed portions to obtain a positive relief image. Thereafter, the image-bearing plate was treated with an aqueous 1% phosphoric acid to make the image clearer and mounted on an off-set printing machine to obtain a great number of prints with good quality of image.

EXAMPLE 7

10 g of the compound (8) obtained in the Synthetic Example 6, 0.5 g of nitroacenapthene, 3 g of phenol-formalin-novolac resin and 60 mg of a triphenylmethane dye (Victoria Blue Base F.4.R., product of BASF) were dissolved in a mixed solvent of γ-butyrolactone and dioxane (1:4). The solution was applied onto a usual substrate for a printed circuit (e.g. plate obtained by laminating a copper foil on a support such as a bakelite plate, phenol resin-impregnated paper, or epoxy resin-impregnated paper) and dried. The resulting photosensitive plate was superposed on its photo-sensitive surface with a transparent film original, which was set in a vacuum printer and exposed to light for 2 minutes by means of a mercury lamp of 200 V and 3 KW at a distance of about 90 cm from the object, followed by developing with ethyl cellosolve for 1 minute and drying to obtain a photosensitive relief image.

The image-bearing plate was immersed for etching in an aqueous 40 wt% ferric chloride solution. Thereafter, γ-butyrolactone was applied to dissolve out the relief image thereby obtaining a printed circuit plate of good quality.

EXAMPLE 8

10 g of the compound (7) obtained in the Synthetic Example 5, 0.5 g of 2 nitrofluorene, 2 g of naphthoquinone-1,2-diazido-2,5-sulfoneazide, 1 g of tricresyl phosphate and 200 mg of 2-(p-dimethylaminostyryl)benzthiazole were dissolved in ethyl cellosolve. The solution was applied onto a roughened aluminum plate and dried. The resulting photo-sensitive plate was superposed on its photosensitive surface with a negative transparent film original, followed by setting in a vacuum printing machine and exposing for 2 minutes by means of a 500 W tungsten lamp thereby obtaining a deep red, clear image. The image was developed with ethyl cellosolve to obtain a relief image with excellent hydrophobic property and mechanical strength. The image-bearing plate was mounted on an off-set machine to obtain a great number of prints with good quality of image.

EXAMPLE 9

7.0 g of the compound (4) obtained in the Synthetic Example 4, 500 mg of Victoria Pure blue BOH, and 50 mg of cellulose ethyl ether were dissolved in 100 ml of a mixed solvent of dimethylformamide and cyclohexanone (1:1). The solution was applied onto a polyester base and dried. The resulting photosensitive film was intimately contacted on its photosensitive surface with a negative original, followed by exposing for 4 minutes by the use of a 3 KW mercury lamp at a distance of 1 m from the original and developing with ethyl cellosolve to obtain a blue clear positive image. The image-bearing film was suitably usable as a wash-off film which has particular utility in the field of various art techniques such as a proof sheet for printing, a telop for color television service, a title for motion picture, photo-composing letter or character, instant lettering, type tone and screen tone.

What we claim is:

1. A photosensitive composition characterized by comprising as its main photosensitive ingredient a photosensitive polymeric compound having in its polymeric molecule at least 5 mole percent of a structural unit of the following general formula

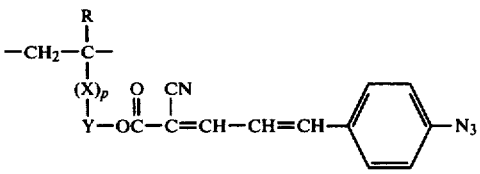

in which R represents a hydrogen atom, a halogen atom or an alkyl group, Y represents a substituted or unsubstituted phenylene group or a substituted or unsubstituted naphthylene group, p is 0 or 1, and when p=1, X is a divalent organic group serving to join therethrough the carbon atom of the main chain of the polymer and the carbon atom of the aromatic ring expressed by Y and —CH$_2$—C— is part of the main chain of the polymer's compound.

2. The composition of claim 1, wherein the structural unit is present in an amount of 10–60 mole percent.

3. The composition of claim 1, wherein the polymeric compound has a molecular weight of 1,000–1,000,000.

4. The composition of claim 2, wherein the polymeric compound has a molecular weight of 2,000–100,000.

5. The composition of claim 1, wherein the polymeric compound is prepared by subjecting a polymer which is obtained by homopolymerizing, or copolymerizing with another copolymerizable monomer, a monomer of the formula

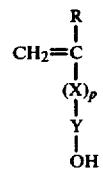

in which R represents a hydrogen atom, a halogen atom, or an alkyl group, Y represents a substituted or unsubstituted phenylene group or a substituted or unsubstituted naphthylene group, p is 0 or 1, and when p=1, X represents a divalent organic group, to reaction with p-azidocinnamylidene-α-cyanoacetic chloride in the presence of an organic or inorganic base.

* * * * *